US006906538B2

United States Patent
Patterson et al.

(10) Patent No.: US 6,906,538 B2
(45) Date of Patent: Jun. 14, 2005

(54) ALTERNATING PULSE DUAL-BEAM APPARATUS, METHODS AND SYSTEMS FOR VOLTAGE CONTRAST BEHAVIOR ASSESSMENT OF MICROCIRCUITS

(75) Inventors: Oliver Desmond Patterson, Windermere, FL (US); Michael Scott Twiford, Orlando, FL (US)

(73) Assignee: Agere Systems, Inc., Allentown, PA (US)

( * ) Notice: Subject to any disclaimer, the term of this patent is extended or adjusted under 35 U.S.C. 154(b) by 16 days.

(21) Appl. No.: 10/675,581

(22) Filed: Sep. 30, 2003

(65) Prior Publication Data

US 2005/0068052 A1 Mar. 31, 2005

(51) Int. Cl.[7] ........................ G01R 31/305; G01N 23/00
(52) U.S. Cl. ........................................ 324/751; 250/310
(58) Field of Search ................................. 324/751, 538, 324/158.1, 501; 438/14–18; 250/310, 491.1, 559.42–43; 257/48

(56) References Cited

U.S. PATENT DOCUMENTS

| | | | |
|---|---|---|---|
| 4,417,203 A | * 11/1983 | Pfeiffer et al. | ............... 324/501 |
| 6,038,018 A | 3/2000 | Yamazaki et al. | |
| 6,091,249 A | 7/2000 | Talbot et al. | |

\* cited by examiner

*Primary Examiner*—Paresh Patel

(57) ABSTRACT

Voltage contrast-based apparatuses, methods and systems for detection of continuity are described for use in evaluation of conducting components of a microcircuit such as a silicon wafer-based semiconductor chip. Two beams are directed to two separate conducting, electrically floating components on the sample, and are timed and delivered to be alternating pulses. One lower energy beam elicits its target to emit secondary electrons that are detected by an electron detector to produce an image. A second high-energy beam creates a virtual ground at its target. Voltage contrast images indicate whether there is continuity between the two conducting components.

18 Claims, 2 Drawing Sheets

ALTERNATING PULSE DUAL-BEAM APPARATUS, METHODS AND SYSTEMS FOR VOLTAGE CONTRAST BEHAVIOR ASSESSMENT OF MICROCIRCUITS

FIELD OF THE INVENTION

The invention relates to inspection of microstructures, particularly for detection of defects in cross sections of fully or partially fabricated microcircuits with the aid of a charged-particle-beam system. More particularly, the inspection apparatus, methods and systems of the present invention relate to the use of two charged particle beams alternately impinging on two distinct components of a microcircuit, and, by analysis of the consequent voltage contrast behavior, an assessment of the existence of an electrical continuity defect with regard to the two components.

BACKGROUND OF THE INVENTION

Various techniques are used to identify defects in microcircuits, such as are found on silicon wafer-based integrated circuits (ICs), also known as "chips." Inspection tools scan large areas for defects. Review tools get better pictures and gather other information, such as, for example, material composition. The following list of patent and non-patent references, and references therein, describe a range of approaches to identify defects in microcircuits: U.S. Pat. No. 4,678,988 to Brust; U.S. Pat. No. 4,755,748 to Lin; U.S. Pat. No. 5,521,516 to Hanagama et al.; U.S. Pat. No. 5,523,694 to Cole; U.S. Pat. No. 6,038,018 to Yamazaki et al.; U.S. Pat. No. 6,091,249 to Talbot et al.; U.S. Pat. No. 6,201,240 to Dotan et al., U.S. Pat. No. 6,232,787 to Lo et al.; and 6,573,736 to Lee et al.; V. Liang, H. Sur, S. Bothra, "Passive Voltage Contrast Technique for Rapid In-line Characterization and Failure Isolation During Development of Deep-Submicron ASIC CMOS Technology," Proceedings of ISTFA, 221–5 (1998); A. Nishikawa, N. Kato, Y. Kohno, N. Miura, M. Shimizu, "An Application of Passive Voltage Contrast (PVC) to Failure Analysis of CMOS LSI Using Secondary Electron Collection," Proceedings of ISTFA, 239–243 (1999); Patterson, O. D., Drown, J. L., Crevasse, B. D., Salah, A. Harris, K. K., Real Time Fault Site Isolation of Front-end Defects in ULSI-ESRAM Utilizing In-Line Passive Voltage Contrast Analysis, to be published in the Proceedings of the 28th International Symposium for Testing and Failure Analysis, pp. 591–599, November 2002; and T. C. Henry, O. D. Patterson, G. Brown, Evaluation of Automatic Defect Classification for Characterization of Yield-Limiting Defects Identified Through Overlay of Inspection and Electrical Test Data from Short Loop Process Testers, Processings of the Advanced Semiconductor Manufacturing Conference, September 1999. These patents and non-patent references cited in this disclosure, are hereby incorporated by reference into this disclosure.

One technique to inspect for defects is optical inspection. Optical inspection systems create an image of a microcircuit that is inspected for anomalies. However, such images generally have insufficient resolution to enable identification of the smallest features, and often do not provide a sufficient visual distinction of defects that are electrically significant from those which are not. Optical inspection also suffers from not providing sufficient depth of focus for detection of sub-surface defects. Even more relevant is that the ability of optical inspection to detect subsurface defects that result in undesired electrical continuity (i.e., a short) or discontinuity (i.e., an open) is very limited. Subsurface defects may be detected if they are directly below a transparent layer like a dielectric film. Often, though, they are hidden under non-transparent material like a tungsten plug or metal runner.

Charged-particle-beam inspection systems offer advantages over optical inspection systems when inspecting microcircuits fabricated with critical-dimension technology of about 0.35 micron and smaller. In that the range of microcircuits' critical dimension is about 0.25 to about 0.15 microns, and progressing to ever-smaller size, charged-particle-beam inspection systems are in common use in semiconductor research and manufacturing. Charged-particle-beam inspection provides sufficient resolution to image small features such as contact holes, gates, and polysilicon lines. Also, charge-particle-beam techniques can be used to detect otherwise unobserved killer defects (defects that require scrapping a wafer), such as based on electrical continuity, with the use of images obtained from voltage contrast (VC) behavior techniques.

The basic principle of voltage contrast can be explained by comparing two biasing conditions of a semiconductor element, such as surfaces of a silicon semiconductor substrate. Biasing these surfaces to a value of, for instance, −5 Volts results in these surfaces having a relatively higher net concentration of negative charges close to their surface. Any electrons that are externally directed at the surface of the element are therefore rejected at a high rate since these electrons are repelled by the negatively charged surface. Based on detection of such repelled electrons, a brighter contrast will therefore be observed at surfaces that are affected by the net negative bias in comparison to floating components that are not subject to the −5 V bias.

In contrast, biasing an element to a value of, for instance, +5 Volts results in a zone of positive charges close to the surface of the biased element. Any electrons that are externally directed at these surfaces are therefore attracted by the surface at a high rate, since these electrons are attracted or trapped by the positively charged surfaces of the element. Accordingly, a comparatively less bright contrast will therefore be observed at such surfaces that are affected by the net positive bias.

Thus, depending on the bias applied to a circuit, floating conductors and conductors connected to n-diffusion regions should have higher or lower voltage than grounded conductors and conductors connected to p-diffusion regions in many case a the film isn't biased with a separate power supply as is described in the aforementioned reference. The use of voltage contrast images, whether or not obtained by separate biasing based on the above principles, provides images of differing brightnesses. Many electrical defects in integrated circuit structures are identified in a typically generated voltage contrast image if the defect causes a feature to appear brighter or darker than is expected based on the designed circuitry.

Accordingly, in many instances continuity defects of IC semiconductor devices are located by comparing a sample's performance with nominal or expected behavior of the devices. Often VC is applied whereby a voltage of a specific frequency is applied to the point that is being measured, and the applied voltage causes secondary electrons to be released as a result of bombardment by primary electrons at the point that is being measured. The secondary electrons are observed by a detector and are further amplified into a signal that can be measured and evaluated. Specifically, the observed signal is analyzed for the frequency or frequency spectrum that is emitted by the point under investigation.

Comparison of the VC-obtained image to expected continuity based on the design of the circuitry indicates whether or not, for example, a short or an open exists. In other situations merely the presence or lack thereof of a ground provides the desired contrast to differentiate floating from grounded structures.

However, the above VC methods are of limited value when the component being evaluated is not amenable to biasing by typical methods, such as applying a charge to or grounding the circuit (the use of charge or ground depending on the particular VC method used and the sample). For example, when testing for continuity defects in cross sections of fully or partially fabricated microcircuits, it can be very difficult, if not impossible (depending on the angle of the cut and the geometry of the circuitry), to apply a charge or a ground through the integrated microcircuit to a particular cross-sectioned micro-component, such as a conductor. In particular, traditional methods to ground a particular component or circuit are not easily or reliably achieved in such cross section.

Accordingly, despite considerable advances in VC technology to detect defects in silicon siliconwafer-based microcircuits, the present state of the art does not provide a suitable means to detect the presence of shorts or opens under certain circumstances. The above stated evaluation of components exposed to view in a cross section under analysis one example of the application of the present invention. More generally; the present invention apparatuses, methods and systems are utilized to detect continuity defects between any two closely spaced conductors.

SUMMARY OF THE INVENTION

The apparatus, methods and systems of the present invention evaluate the presence of electrical continuity defects, such as shorts or opens, in circuits of a microcircuit. In one embodiment, the evaluation is achieved by directing alternating pulsing of two electron beams of different voltages to, respectively, two different electrically floating, conductive components of a silicon wafer-based microcircuit. One of the pulsing beams strikes the first component under low beam voltage conditions. This creates a stream of secondary electrons at the particular component that the beam is striking. This stream is detected by electron detector(s) standard for electron detection in VC analyses, and an image is therefrom generated. The other beam is of sufficiently elevated voltage to create a "virtual ground" at the particular component that it is striking. An analysis of the VC image, or behavior, so created by this alternating pulsing of beams indicates whether a short or open exists between the two micro-components. One aspect of the invention is that, to avoid interference between the beams, the alternating pulsating sequencing of the two beams is necessary.

Evaluation of the VC images for this embodiment is as follows. If the two components that are being bombarded by the alternatingly pulsing beams are in fact connected, then the charge on the first component will ramp up and down each time the beams are cycled. The brightness of this first component correspondingly cycles up and down as detected by the electron detector receiving secondary electrons from this source. If the two components are not connected, then a positive charge will build up on the first component as secondary electrons are emitted from its surface. This will be registered by the electron detector as a dark imaged component. In the latter scenario, the second component, the "virtual ground," will appear brighter than in the first scenario since it is replacing emitted electrons from ground and thus can continue to emit electrons without a positive charge build-up.

Thus, one feature of the present invention is the ability to detect shorts and opens between two IC circuit conducting components that are exposed in a cross section of a microcircuit being evaluated. Another feature of the present invention is the ability to detect shorts and opens between one IC circuit conducting component to which a "virtual ground" is applied by the second, higher energy beam of the two pulsing beams, and evaluating a plurality of other components which receive electrons or other particles from the first, lower energy beam. While these approaches are particularly well-suited for evaluation of conducting components exposed in cross sections of IC circuits, these features of the present invention find application in other evaluations of IC circuits where the detection of shorts or opens is desired between two closely spaced conductors.

The above-described and other features and advantages of the apparatus, methods and systems of the present invention will become apparent upon consideration of the following detailed description of the invention and the figures related thereto, and the appended claims.

DETAILED DESCRIPTION OF THE INVENTION

Figure 1:
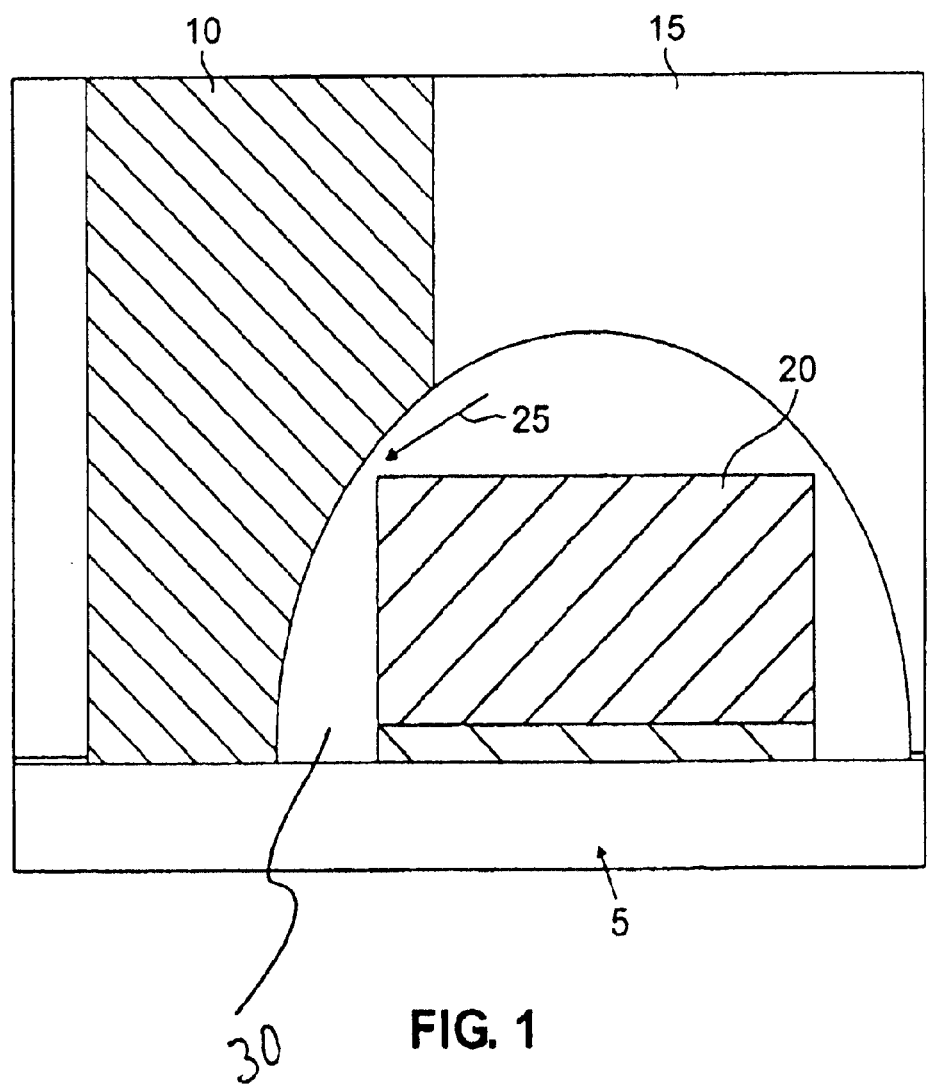
FIG. 1 is a schematic representation of a cross section of a microcircuit under evaluation, in which two conducting components are in closer proximity than specification.

As used throughout this specification, including the claims, the term "computational device" is meant to include, without being limited to, a dedicated programmed circuit (including, but not limited to, an integrated circuit or a microprocessor that is capable of receiving data signals from one or more sources; a programmable general purpose computational device, such as a computer, or other computational control device, that is capable of receiving data signals from one or more sources, and a programmable special-purpose computational device, such as a computer, that is capable of receiving data signals from one or more sources. As used throughout this specification, including the claims, the term "computational control device" is meant to include, without being limited to, an integrated circuit or a microprocessor; a programmable general purpose computational device, such as a computer, and a programmable special-purpose computational device, such as a computer, that is capable of sending control signals to one or more destinations.

As used throughout this specification, including the claims, the terms "positioning" is meant to include, without being limited to, movements of either a charged particle beam, its physical source, or its target by any means, or combination of means, to align the particles of the beam with the target. Such means include, but are not limited to physical adjustment of the gun itself, adjustment of the travel path of the beam, such as by use of one or more scanning coils along the path and/or one or more of the condensers, and alignment of the stage, that is, physically moving the sample upon which the target exists. It is noted that whether it is stated that x is positioned in relation to y, or vice versa, either x, y, or both x and y may be moved to achieve the desired result of such positioning. When iterative positioning of both beams to their respective targets is done, such as by the means indicated above or others, this is referred to as "co-positioning."

As used throughout this specification, including the claims, the term "secondary electron" or "secondary electrons" are defined as follows. Secondary electrons are specimen electrons that obtain energy by inelastic collisions with beam electrons. They are defined as electrons emitted from the specimen with energy less than 50 ev. Secondary electrons are predominantly produced by the interactions between energetic beam electrons and weakly bonded conduction-band electrons in metals or the valence electrons of insulators and semiconductors. Because there is a great difference between the amount of energy contained by beam electrons compared to the specimen electrons, only a small amount of kinetic energy can be transferred to the secondary electrons.

As used throughout this specification, including the claims, the term "virtual ground" is meant to include, without being limited to, a condition in a conducting component, imparted such as by striking the component repeatedly with a high energy electron or ion beam, that provides certain properties or effects of being grounded, without actually being grounded.

The requirements for the systems and methods of the present invention can be summarized as follows. Two beams of electrons, or one beam of electrons and one beam of ions, are required to be delivered accurately and precisely, at an alternatingly pulsating frequency, to micro-adjacent points of a sample set onto an appropriate sample stage.

A first beam, focused to strike one or more conducting elements of a microcircuit, provides electrons at low beam voltage conditions, that is to say, typically less than about 2.5 kV. This is to induce the emission of a relatively high number of secondary electrons, which, without a ground, results in the building up of a positive charge.

A second beam can be an electron beam or an ion beam. The second beam is directed to a conducting component under high beam voltage conditions, that is, above at least 2.5 kV. The exact voltage marking the transistion from positive charge buildup to negative charge buildup depends on the material and can be determined by monitoring of the charge buildup during excitation or by determining the value on a sample material prior to use on an actual component. At the voltage and frequency applied, and given the mass of the conducting component, this generates a "virtual ground" that, if in continuity with the first conducting component, will affect the voltage contrast behavior of the first conducting component. As may be required for a particular sample, the exact voltage and frequency to generate a "virtual ground" for a conducting component of a particular mass (and relationship to the first conducting component) is determined by routine experimentation by one of ordinary skill in the art.

The provision of the alternating pulse dual-offset-beams is accomplished by any of several arrangements of equipment. For instance, electron microscopes with a dual beam system, equipped with two individual ion or electron guns, are known in the art. Also, there have been recently developed single-column-focused ion/electron beam (FIEB) systems. These are based on a modified FIB beam column, and are stated to effectively transform a FIB into a scanning electron microscope. (See L. W. Chen and Y. L. Wang, "First Operation of a Focused Ion/Electron Beam System Based on a Dual Ion/Electron Source", App. Phys. Lett. 73, 2212–2214 (1998), and "Stable Field-Induced Electron Emission from a Solidified Liquid Metal Ion Source", Appl. Phys. Lett. 72, 389–391(1998)). Such devices also are known as dual-beam FIB-SEMs.

As noted, the need to have the pulses of electrons from the first beam and the electrons (or ions) from the second beam be offset in delivery is to avoid interference. This is accomplished by proper programming of a control computer, or other computational control device, that sets both the timing and the voltage of the two beams.

To begin a sample evaluation, the prepared sample is mounted on a specimen stub or holder suitable for the particular specimen. Then the specimen is placed on the stage. The stage can be of any type that is suitable for stable imaging at the magnification to be used. In general the stage used should be vacuum-environment compatible, non-magnetic to minimize unwanted beam deflection, cleanroom compatible and reasonably accurate. In the example below, the sample is a cross section of a microcircuit, and the plane of the cross section is perpendicular to the surface of the stage.

Once the particular dual-beam SEM or FIB-SEM is selected, the related and accessory equipment needed to support the present methods and systems is added to this machine to provide all functional requirements for the physical and control aspects of the process. Examples of specific optical and mechanical alignment devices, arrangement of laser interferometer for tracking alignment, stages, imaging system including micro-processor, control computer, and the like, are found in U.S. Pat. No. 6,232,787, to Lo et al., column 3, line 31, through column 6, line 23, which is incorporated by reference.

It is recognized that there are many production steps in the manufacture of a silicon wafer-based semiconductor microcircuit. For example, typically 1 to 3 polysilicon levels and 2 to 6 metal levels are formed over a silicon wafer in a semiconductor manufacturing process. Some conductor components are designed to be electrically isolated (i.e., "floating"), while other conductor components are designed to be electrically connected, i.e., grounded, to the substrate. At any one of these steps, particularly during the development and ramp up stages of production, destructive or non-destructive sample evaluations are conducted to assess the effectiveness of, for instance, the alignment of the masks, the effectiveness of ion implementation, etch, photoresist and dopant application steps with regard to killer defects (defects that kill the device.).

In one aspect of the present invention, a silicon wafer-based microcircuit at some stage of production is in need of evaluation. Per the above, this may be at any stage of the multi-step production process or for an end product chip, whether during initial development and ramp up, or for quality assurance or other evaluation of a well-established production run. Part of the evaluation protocol requires analysis of a cross section of the microcircuit at an area suspected or determined to be a potential source of a problem. Visual observation of the cross section reveals a thinner than normal insulation layer between two conductors, one a drain contact, the other a gate. This further suggests that the problem is nearby, that the drain contact is mis-aligned and possibly shorting to the gate. However, the visual image of the cross section alone does not provide any proof of this. Also, given the state of the sample, being a cross section and with neither of the two conducting structures grounded, typical methods of applying VC are inapplicable.

EXAMPLE 1

Figure 2:
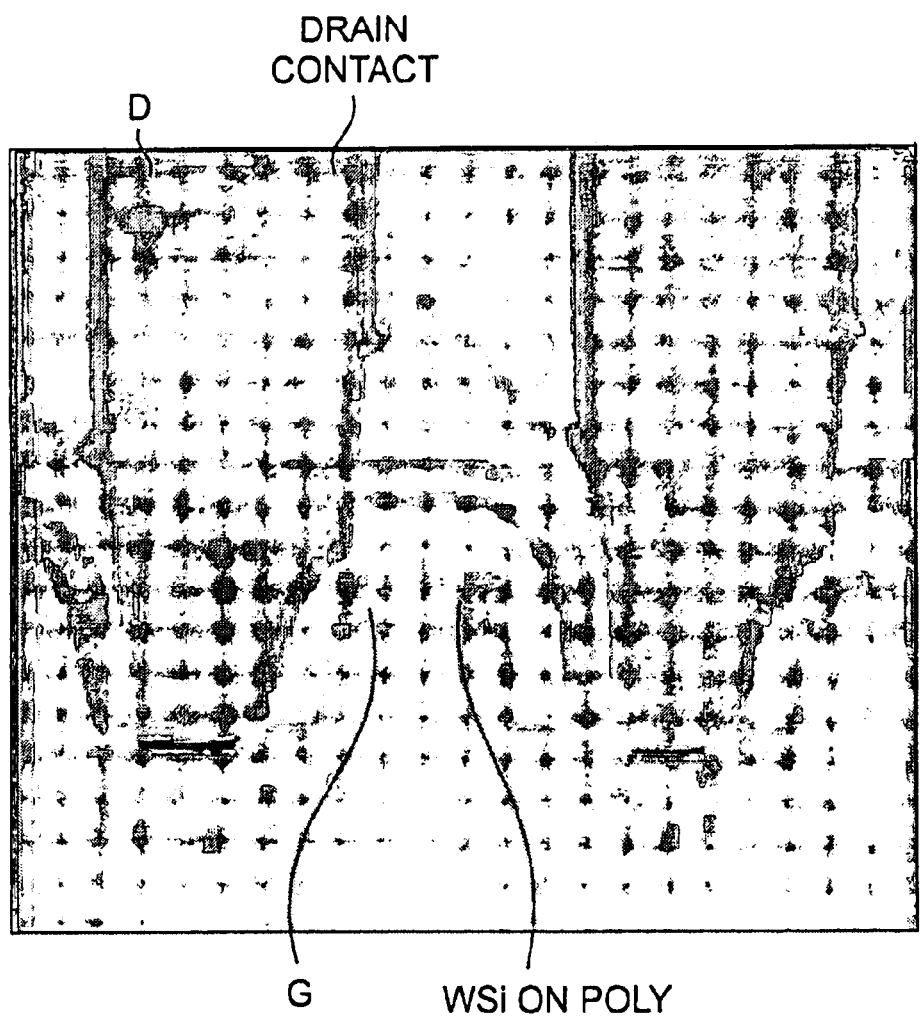
FIG. 2 is a photographic image of a microcircuit cross-section.

FIG. 1 is a schematic representation of a cross section, 5, of a microcircuit under evaluation. During the visual evaluation of a SEM it was noted that a first conducting component 10, a drain contact, is close in proximity to a second conducting component, 20, a nearby gate. That is, the cross section shows a thin amount of insulating material 30 separating the closest aspects of the two conducting components. This closest area is shown by the arrow 25. FIG. 2 is a microphotograph of a similar closeness of an actual drain D to an adjacent component G.

This alignment may represent an unintended misalignment of one of the masks, an error in the production of a mask, an overly aggressive etch, or any number of other production-related steps. At this point in the evaluation, it is desirable to know whether a short exists between the first conducting component 10, and the second conducting component, 20. Specifically, the cross section shows only a single plane of the orientation of the two structures Since these structures are aligned in parallel over a distance below this plane, it is very possible that the insulating layer in another plane is so thin as to lead to a short when an operational voltage is passed through these components.

Therefore, to evaluate the electrical continuity between the first conducting component 10, and the second conducting component, 20, the cross section, 5, is mounted securely onto a stub, or sample holder (not shown), which is then secured to a stage (not shown). The planar surface, 15, of the cross section, 5, is positioned toward the sources of charged particles generated in a dual-beam SEM (or, if desired, a FIB-SEM with appropriate alternate pulsing dual beam capability). The stage is passed into the SEM vacuum chamber, such as by passing through an air lock. Then the stage is moved into general position to the beams' target position, and then aligned more precisely.

It is noted that there are various protocols and procedures to align and focus a sample to be evaluated by a standard, single beam SEM. These can be quite specific and variable depending on the manufacturer and model. As such, the exact procedure for focusing the two target points in this example need not be detailed in particularity. However, in general the positioning may include use of visual microscope for initial gross positioning, confirmation of position changes by laser interferometer. More specifically, in general the beam itself is adjusted by a combination of the gun adjustment (i.e., the gun tilt controls, and also gun horizontal adjustment, as needed), and aperture alignment. This and the movement of the sample by stage movement bring the first of the two targets into proper alignment.

Once a first electron beam, generated by a first charged particle source, is aligned to strike the first conducting component, 10, then a second source of charged particles is positioned in relation to the second conducting component, 20, so that the alignment is such that the second beam will strike the second conducting component, 20. The second source of charged particles provides a beam of electrons, or alternatively, a beam of ions. The exact manner of aligning this second beam, once the first beam is aligned, depends on the relationship of the two beams, the extent of the shared path, and other factors.

Also, alternatively, it is noted that the alignment of the two beams to their respective targets is achieved by an iterative process that involves making adjustments that either affect the target position of both beams, or that affect one or the other beam. In one embodiment of the first case an iterative adjustment regime starts once there is a approximately equal distance between the first beam's strike point and its target and between the second beam's strike point and its target. Then, by making adjustments that narrow the gaps and move to center (the idealized center being between the two targets), both beams are brought closer to their respective targets. Final adjustments may be made with the stage or with an adjustment that affects only one of the beams (such as a minor gun tilt change).

In summary, it is noted that the positioning to align the first beam to the first conducting component, 10, may occur before or after the positioning to align the second beam to the second conducting component, 20. As to the alignment of two charged particle beams that are to impinge upon two closely positioned small targets, any combination of means for such alignment, as are known to those of ordinary skill in the art, are employed. For example, and not to be limiting, the alignment capabilities of one of the beam generators itself may be such that after the alignment of one beam, the other beam generator is aligned to the other target by adjusting means of the beam generator in physical relationship to its mounting into the EM housing, column housing, etc.

In typical operation of the first beam, this beam can be used in a "tight" scanning mode, to scan not only the full surface of the first conducting component, but also the surrounding structures. This provides a better image of that component in relation to its surrounding materials. This movement is readily programmed into the control computer, or other computational control device, which send signals to the scanning coil to actuate the desired path. However, the high energy beam that strikes the second conducting component, to create a virtual ground, is not moved from the surface of that component until testing is complete for the desired other conducting component(s) in its relevant vicinity.

Thus, after positioning both beams to their respective targets of conducting components, the controller directs alternating pulses of charged particles from the two sources to their respective targets. The duration of a cycle and the duration of the entire evaluation depends, among other factors, on the size and configuration and material of the targets, and the voltage and frequency of the pulses.

As noted above, what has been designated as the first beam directs low energy electrons at a voltage that results in the production of secondary electrons. Under the pulsating alternate charge system of the present invention, the level and behavior of secondary electrons depends in large part on whether the first targets conducting component is receiving charge from the virtual ground of the second conducting component (i.e., in this example, whether there is a short). Table 1 below summarizes expected behavior under different conditions of the present test system, and compares these with a group of typical results of a standard voltage contrast method:

TABLE 1

Comparison of Results with Present Invention System ("ADB") and with Standard Voltage Contrast ("STD")

| Test Type | Should 1st Target Have Continuity with 2nd Target for ADB case or Ground for STD case? | Appearance of 1st Target (one under consideration) | Interpretations and Comments |
|---|---|---|---|
| ADB | YES | Target brightness fluctuates | Continuity exists, this test passed. |

TABLE 1-continued

Comparison of Results with Present Invention System ("ADB") and with Standard Voltage Contrast ("STD")

| Test Type | Should 1st Target Have Continuity with 2nd Target for ADB case or Ground for STD case? | Appearance of 1st Target (one under consideration) | Interpretations and Comments |
|---|---|---|---|
| ADB | YES | Target stays dark | No continuity, this test failed by microcircuit. |
| ADB | NO | Target stays dark | No continuity, this test passed. |
| ADB | NO | Target brightness fluctuates | Continuity exists, this test failed. |
| STD | YES | Bright | Continuity exists, this test passed. |
| STD | YES | Dark | No continuity, this test failed by microcircuit. |
| STD | NO | Dark | No continuity, this test passed. |
| STD | NO | Bright | Continuity exists, this test failed. |

Thus, in summary, if the first and second conducting components are connected, then the charge on the first conducting component will ramp up and down each time the beams are cycled. The brightness of the first conducting component as detected at the electron detector also cycles up and down. This is a desired result if the two components are supposed to have continuity (first row of table). If the first and second conducting components are not connected, then a positive charge builds up on the first conducting component after the initial striking of the first beam drives away a quantity of electrons. The positive charge builds up, and this results in less electrons emitted to the electron detector and therefore a darker image of the first conducting component. This is a desired result if the two components are not supposed to have continuity (third row of table).

Thus, the results of this system are more dynamic, but are consistent with the results of a traditional voltage behavior test strategy, as shown in the last four rows of Table 1.

Looking beyond the specific parameters of Example 1, it is recognized that in some uses of the present invention, the high energy beam is directed to a single conducting component and the low energy beam is scanned over an area that includes two or more conducting components of interest for determining which ones are "floating" relative to the virtual ground and which ones have continuity to that single conducting component.

Also, it is recognized that the voltage applied by the high-energy beam is adjusted depending on the objectives of the evaluation. For instance, a voltage that represents the maximum designed load on that conductor is applied for a designated period to test for the presence of a short under normal operating conditions. Then the energy is increased, step wise or continuously, at a specified rate to determine at what point in excess of the maximum designed load a short is formed. The information so acquired may be used in analysis of whether a microcircuit is utilizable and/or reliable.

Thus, while the preferred embodiments of the present invention have been shown and described herein, it is apparent that such embodiments are provided by way of example only. Numerous variations, changes, substitutions and modifications will occur to those of ordinary skill in the art without departing from the invention herein. Accordingly, it is intended that the invention be limited only by the spirit and scope of the appended claims.

We claim as our invention:

1. A voltage contrast method to determine electrical continuity between a first and a second conducting component of an integrated circuit, comprising
    a. positioning said integrated circuit in relation to a first charged particle source to align said first charged particle source to direct a first beam of charged particles to strike said first conducting component;
    b. positioning a second charged particle source in relation to said integrated circuit to align said second charged particle source to direct a second beam of charged particles to strike said second conducting component;
    c. alternatingly pulsing said beams of said first charged particle source and said second charged particle source;
    d. detecting secondary electrons from said first conducting component; and
    e. evaluating the pattern of said secondary electrons to determine whether said first conducting component has electrical continuity with said second conducting component.

2. The voltage contrast method of claim 1 wherein the voltage of said first beam is less than about 2.5 kV.

3. The voltage contrast method of claim 1 wherein the voltage of said second beam is greater than about 2.5 kV.

4. The voltage contrast method of claim 1 wherein said first beam is an electron beam and said second beam is an electron beam.

5. The voltage contrast method of claim 1 wherein said first beam is an electron beam and said second beam is an ion beam.

6. The voltage contrast method of claim 1 wherein said alternatingly pulsing of said beams is directed to said first and second conducting components exposed on a cross section of said integrated circuit.

7. A voltage contrast method to determine electrical continuity between a first and a second conducting component of an integrated circuit, comprising
    a. co-positioning said integrated circuit in relation to a first charged particle source and a second charged particle source so as to align both said first charged particle source to direct a first beam of charged particles to strike said first conducting component and said second charged particle source to direct a second beam of charged particles to strike said second conducting component;
    b. alternatingly pulsing said beams of said first charged particle source and said second charged particle source to provide off-set receipt of said first beam and said second beam to said second conducting component, the frequency of alternate pulsing and the frequencies and intensities of the first and second beams being set so as to avoid interference between said first and second beams, said first beam producing a net negative charge when said first conducting component is not grounded and said second beam imparts a virtual ground to said second conducting component;
    c. detecting secondary electrons from said first conducting component; and
    d. evaluating the pattern of said secondary electrons to determine whether said first conducting component has electrical continuity with said second conducting component.

8. The voltage contrast method of claim 7 wherein the voltage of said first beam is less than about 2.5 kV.

9. The voltage contrast method of claim 7 wherein the voltage of said second beam is greater than about 2.5 kV.

10. The voltage contrast method of claim 7 wherein said first beam is an electron beam and said second beam is an electron beam.

11. The voltage contrast method of claim 7 wherein said first beam is an electron beam and said second beam is an ion beam.

12. The voltage contrast method of claim 7 wherein said alternatingly pulsing of said beams is directed to said first and second conducting components exposed on a cross section of said integrated circuit.

13. An alternating pulse dual-beam system for voltage contrast behavior assessment of integrated circuits, comprising:
   a. a first charged particle source focusable on a first conducting component of said microcircuit;
   b. a second charged particle source focusable on a second conducting component of said microcircuit;
   c. an electron detector suitably positioned and oriented to detect electrons emitted by said first conducting component;
   d. a stage for mounting a sample of said integrated circuit to be in a position to receive charged particles from said first charged particle source and said second charged particle source without a need for movement of the stage; and
   e. at least one computational control device to send control signals to said first charged particle source and said second charged particle source in a manner to provide alternating pulses of first particles from said first charged particle source to said first conducting component and second particles from said second charged particle source to said second conducting component;
   f. evaluating the pattern of said emitted electrons to determine whether said first conducting component has electrical continuity with said second conducting component.

14. The system of claim 13 wherein the voltage of a first beam of said first particles is less than about 2.5 kV.

15. The system of claim 14 wherein the voltage of a second beam of said second particles is greater than about 2.5 kV.

16. The system of claim 15 wherein said first beam is an electron beam and said second is an electron beam.

17. The system of claim 15 wherein said first beam is an electron beam and said second beam is an ion beam.

18. The system of claim 13 wherein said sample is a cross section of said intergrated circuit.

* * * * *